(12) United States Patent
Hool et al.

(10) Patent No.: US 9,385,060 B1
(45) Date of Patent: Jul. 5, 2016

(54) INTEGRATED CIRCUIT PACKAGE WITH ENHANCED THERMAL CONDUCTION

(71) Applicant: Altera Corporation, San Jose, CA (US)

(72) Inventors: Vincent Hool, Pleasanton, CA (US); Minghao Shen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/341,586

(22) Filed: Jul. 25, 2014

(51) Int. Cl.
    *H01L 21/44*    (2006.01)
    *H01L 23/34*    (2006.01)
    *H01L 21/48*    (2006.01)
    *H01L 23/373*   (2006.01)

(52) U.S. Cl.
    CPC ............ *H01L 23/34* (2013.01); *H01L 21/4871* (2013.01); *H01L 23/3736* (2013.01)

(58) Field of Classification Search
    CPC ..... H01L 21/4871; H01L 23/34; H01L 23/36; H01L 23/3736; H01L 2225/1094; H01L 2225/06589
    USPC ................... 438/108, 113, 122; 257/E23.181
    See application file for complete search history.

(56) References Cited

U.S. PATENT DOCUMENTS

| | | | |
|---|---|---|---|
| 3,930,114 A | 12/1975 | Hodge | |
| 4,612,601 A | 9/1986 | Watari | |
| 5,541,446 A | 7/1996 | Kierse | |
| 6,188,578 B1 | 2/2001 | Lin et al. | |
| 6,351,385 B1 | 2/2002 | Featherstone, III | |
| 6,586,279 B1 * | 7/2003 | Davidson | H01L 21/4871 257/704 |
| 6,897,566 B2 * | 5/2005 | Su | 257/778 |
| 7,112,882 B2 * | 9/2006 | Lee | H01L 23/3677 257/706 |
| 7,288,438 B2 * | 10/2007 | Lu | 438/122 |
| 7,420,809 B2 | 9/2008 | Lim et al. | |
| 7,541,508 B2 * | 6/2009 | Vaughn et al. | 585/640 |
| 7,878,615 B2 * | 2/2011 | Reichelsheimer | B41J 2/16579 283/91 |
| 8,063,482 B2 * | 11/2011 | Lu | 257/704 |
| 8,283,776 B2 * | 10/2012 | Chandrasekaran | H01L 23/367 257/675 |
| 8,304,291 B2 * | 11/2012 | Touzelbaev et al. | 438/122 |
| 2002/0142517 A1 * | 10/2002 | Maeda et al. | 438/108 |
| 2005/0140025 A1 * | 6/2005 | Murtuza | H01L 23/3114 257/778 |
| 2006/0244148 A1 * | 11/2006 | Lu | H01L 21/4871 257/772 |

* cited by examiner

Primary Examiner — Nitin Parekh

(57) ABSTRACT

Integrated circuit packages with enhanced thermal conduction are disclosed. A disclosed integrated circuit package includes a package substrate. An integrated circuit die with a layer of metal on its backside is mounted on the package substrate at a first temperature (e.g., reflow temperature). The package further includes a heat spreading lid that is bonded to the integrated circuit die at a second temperature, which is less than the first temperature. The heat spreading lid is formed over the integrated circuit die in which the heat spreading lid makes physical contact with the integrated circuit die via the layer of metal.

11 Claims, 7 Drawing Sheets

US 9,385,060 B1

INTEGRATED CIRCUIT PACKAGE WITH ENHANCED THERMAL CONDUCTION

BACKGROUND

In a semiconductor device package assembly, a semiconductor die (also referred to as a semiconductor integrated circuit (IC) chip or "chip") may be bonded directly to a package substrate. Such a die may be formed with solder bumps affixed to its respective input-output (I/O) bonding pads. During packaging, the die may be "flipped" onto its front surface (e.g., active circuit surface) so that the solder bumps form electrical and mechanical connections directly between the die and conductive metal pads on the package substrate. Underfill is generally applied between the gap formed by the solder bumps in order to further secure the die to the package substrate. A heat spreading lid is then attached over the die. A semiconductor device package of this type is commonly called a flip-chip package.

When electrical current flows through the semiconductor die, the semiconductor die generates heat. As such, passive and active thermal management devices are used to minimize potential damaging effects from heat on the device. Such thermal management devices include heat spreading lids and heat sinks. Heat conducting material may also be used to facilitate heat transfer in the package. Typically, a heat conducting material such as a thermal interface material (TIM) is deposited between the die and the heat spreading lid to enhance heat transfer from the die to the heat spreading lid.

However, device packages using TIM may have problems meeting heat dissipation requirements. Firstly, the thermal conductance of TIM is substantially lower than that of a good thermal conducting metal such as copper, which may result in lower efficiency of heat transfer. For example, the thermal conductivity of an exemplary TIM is approximately 3.8 watts per meter kelvin (W/m-k) while the thermal conductivity of copper is approximately 385 W/m-k. Secondly, the conventional lid attach process uses the package substrate as a physical limiter or stopper to prevent the heat spreading lid from crushing the die. This may cause the layer of TIM between the die and the heat spreading lid to have an inconsistent thickness, which may eventually lead to heat dissipation problems during device operation.

SUMMARY

In accordance with the present invention, apparatuses and methods are provided for creating an integrated circuit package with enhanced thermal conduction.

It is appreciated that the present invention can be implemented in numerous ways, such as a process, an apparatus, a system, or a device. Several inventive embodiments of the present invention are described below.

A method for manufacturing an integrated circuit is disclosed. The method may include assembling an integrated circuit die on a package substrate at a first temperature (e.g., reflow temperature). A first metal heat conducting layer may be formed on the integrated circuit die and a second metal heat conducting layer may be formed on a heat spreading lid. The heat spreading lid is subsequently attached to the integrated circuit die by bonding the first and second metal heat conducting layers at a second temperature. The second temperature may be lower than the first temperature. As an example, the second temperature is at room temperature.

In another suitable embodiment, an apparatus is also disclosed. The apparatus includes a package substrate. An integrated circuit is mounted on the package substrate via microbumps using a first temperature (e.g., reflow temperature). The apparatus further includes a heat conducting lid that is formed over the integrated circuit. A layer of metal heat conducting material is interposed between the integrated circuit and the heat conducting lid. The layer of metal heat conducting material is a combination of two metal heat conducting layers that are mated together using a second temperature (e.g., room temperature). A first metal heat conducting material is formed on the integrated circuit and a second metal heat conducting material is formed under the heat spreading lid. The apparatus further includes support members formed between the heat conducting lid and the package substrate. Alternatively or additionally, molding compound may be formed between the heat conducting lid and the package substrate and surrounding the integrated circuit.

In another suitable embodiment, an integrated circuit package is disclosed. The integrated circuit package includes a package substrate and an integrated circuit die with front and back surfaces. The integrated circuit die is mounted on the package substrate, with the front surface (e.g., active surface) of the integrated circuit die facing the package substrate. A layer of metal may be subsequently formed on the back surface (e.g., non-active surface) of the integrated circuit die. The integrated circuit package further includes a heat spreading lid that is formed over the integrated circuit die. The heat spreading lid makes physical contact with the integrated circuit die via the layer of metal.

Further features of the invention, its nature and various advantages, will be more apparent from the accompanying drawings and the following detailed description of the preferred embodiments.

DETAILED DESCRIPTION

The embodiments provided herein include integrated circuit structures and packaging techniques for improved thermal conductance.

It will be obvious, however, to one skilled in the art, that the present exemplary embodiments may be practiced without some or all of these specific derails. In other instances, wellknown operations have not been described in detail in order not to unnecessarily obscure the present embodiments.

Figure 1:
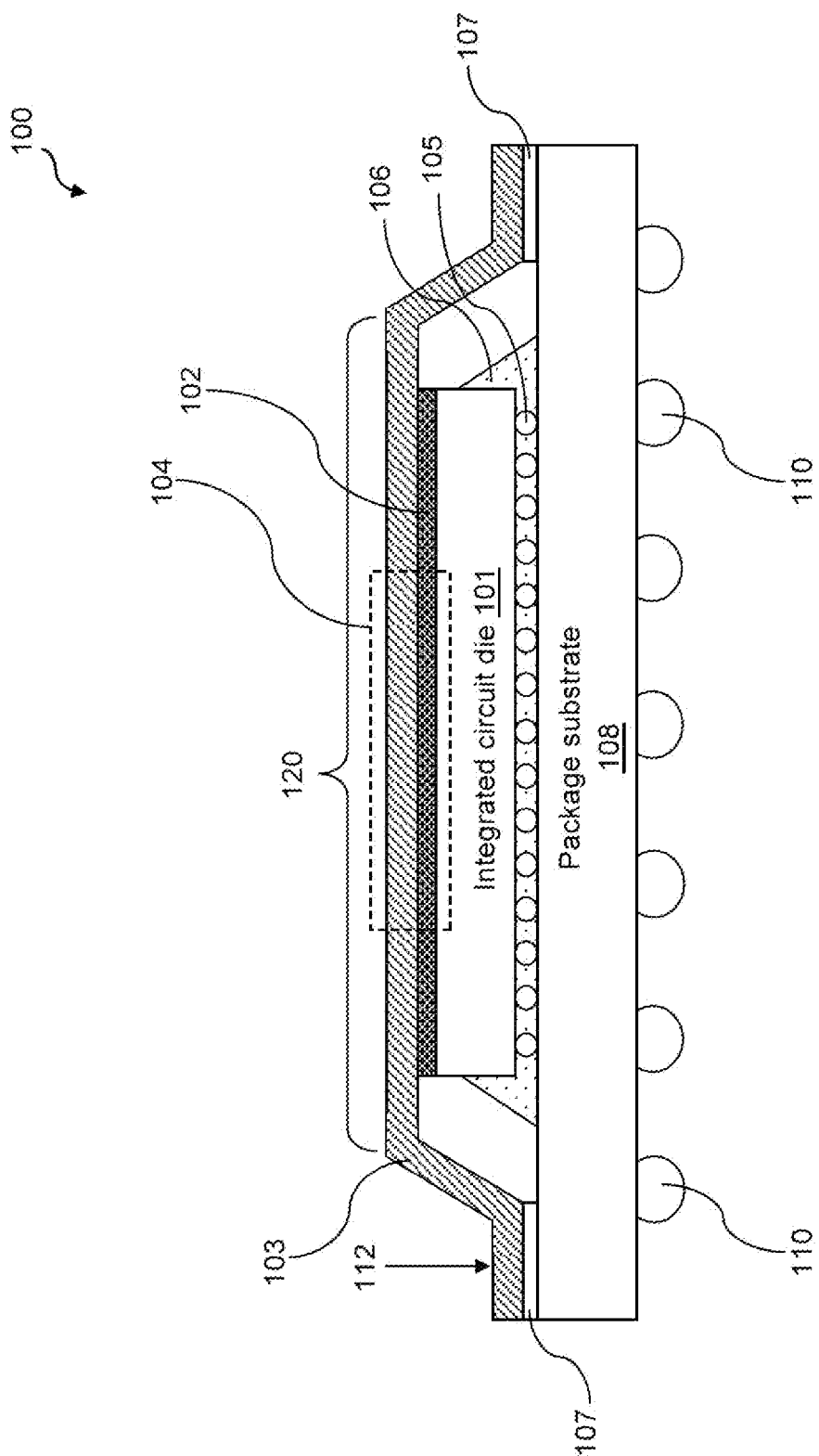
FIG. 1 is a side view of an illustrative integrated circuit package having a metal layer between an integrated circuit die and a heat spreading lid in accordance with an embodiment of the present invention.

FIG. 1 is a side view of illustrative integrated circuit package 100 in accordance with an embodiment of the present invention. Integrated circuit package 100 may include package substrate 108, integrated circuit die 101 and heat spreading lid 103. Integrated circuit die 101 may be placed on package substrate 108. In one embodiment, integrated circuit die 101 may be a small-sized die having a front surface that serves as an active surface of integrated circuit die 101 in which transistors (not shown) are formed.

Integrated circuit die 101 may mechanically and electrically connect to package substrate 108 via solder bumps (e.g., microbumps 105). Accordingly, solder balls 110 may be soldered to package substrate 103 at a reflow temperature, which is approximately 250° C. (as an example). Solder balls 110 may provide electrical connection from integrated circuit package 100 to a printed circuit board (not shown), which may also host other circuits.

A heat conducting lid or heat spreading lid (e.g., heat spreading lid 103) may be attached to package substrate 108 through adhesive 106. Adhesive 106 may be an epoxy in the form of paste or glue. As shown in FIG. 1, heat spreading lid 103 has a "hat-shaped" configuration. As an example, the hat-shaped heat spreading lid 103 has a flat surface (e.g., surface 120) that is raised from the sidewall of the package by an upstanding edge portion. Additionally, a lip (e.g., lip 112), which resembles the brim of a hat, may extend outwardly from the upstanding edge portion. It should be appreciated that heat spreading lid 103 may be made of highly conductive material in order to effectively transfer heat generated by integrated circuit components such as integrated circuit die 101 out of integrated circuit package 100. Heat spreading lid 103 may substantially cover integrated circuit die 101 and a top surface of package substrate 108 to protect integrated circuit die 101 from external contaminants.

A layer of heat conducting metal (e.g., metal layer 102) is interposed between integrated circuit die 101 and heat spreading lid 103. Metal layer 102 may reduce cooling time of integrated circuit die 101 by improving heat transfer between integrated circuit die 101 and heat spreading lid 103. A more detailed description of metal layer 102, highlighted by region 104, will be described later with reference to FIG. 2.

Figure 2:
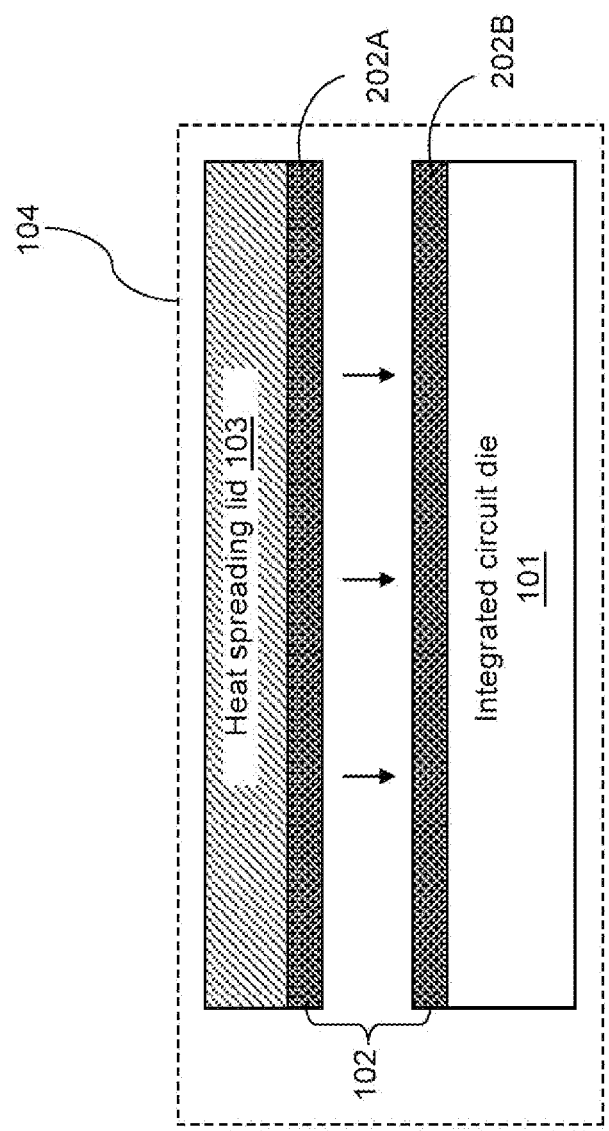
FIG. 2 is a side view of a region of an integrated circuit package in accordance with one embodiment of the present invention.

FIG. 2 is a side view of region 104 of integrated circuit package 100 of FIG. 1 in accordance with one embodiment of the present invention. Region 104 may include integrated circuit die 101 and heat spreading lid 103. In general, a heat spreading lid (or heat conducting lid) has an inner surface (e.g., adjacent to metal layer 102) and an outer surface (e.g., opposite the inner surface). The inner surface of the heat spreading lid may be at least partially plated with metal (e.g., metal heat conducting layer 202A). Similarly, a layer of metal (e.g., metal heat conducting layer 202B) may be formed on the back surface (e.g., non-active surface) of integrated circuit die 101. For example, metal heat conducting layers 202A and 202B may be fabricated from metals and alloys with low temperature melting points (e.g., materials with melting points that are less than 180° C.) such as aluminum, copper, gold, and indium.

Heat conducting material may be deposited on a corresponding surface of integrated circuit die 101 (e.g., back surface of integrated circuit die 101) and heat spreading lid 103 (e.g., inner surface of heat spreading lid 103) by plating. Alternatively, the heat conducting material may be deposited via physical vapor deposition (PVD), chemical vapor deposition (CVD), sputtering, atomic layer deposition (ALD), electrochemical deposition, and other suitable film deposition techniques.

During the lid assembly process, heat spreading lid 103 is attached to integrated circuit die 101, via metal layer 102. Metal layer 102 may conduct heat from integrated circuit die 101 to improve heat dissipation. It should be appreciated that a single metal layer 102 may be formed from direct metal-to-metal bonding or mating between metal heat conducting layer 202A and metal heat conducting layer 202B. In one embodiment, metal heat conducting layer 202A is bonded to metal heat conducting layer 202B at a temperature that is lower than the reflow temperature, as mentioned above. In another embodiment, metal heat conducting layer 202A is bonded to metal heat conducting layer 202B under the influence of Van der Waal's forces, at room temperature.

Figure 3:
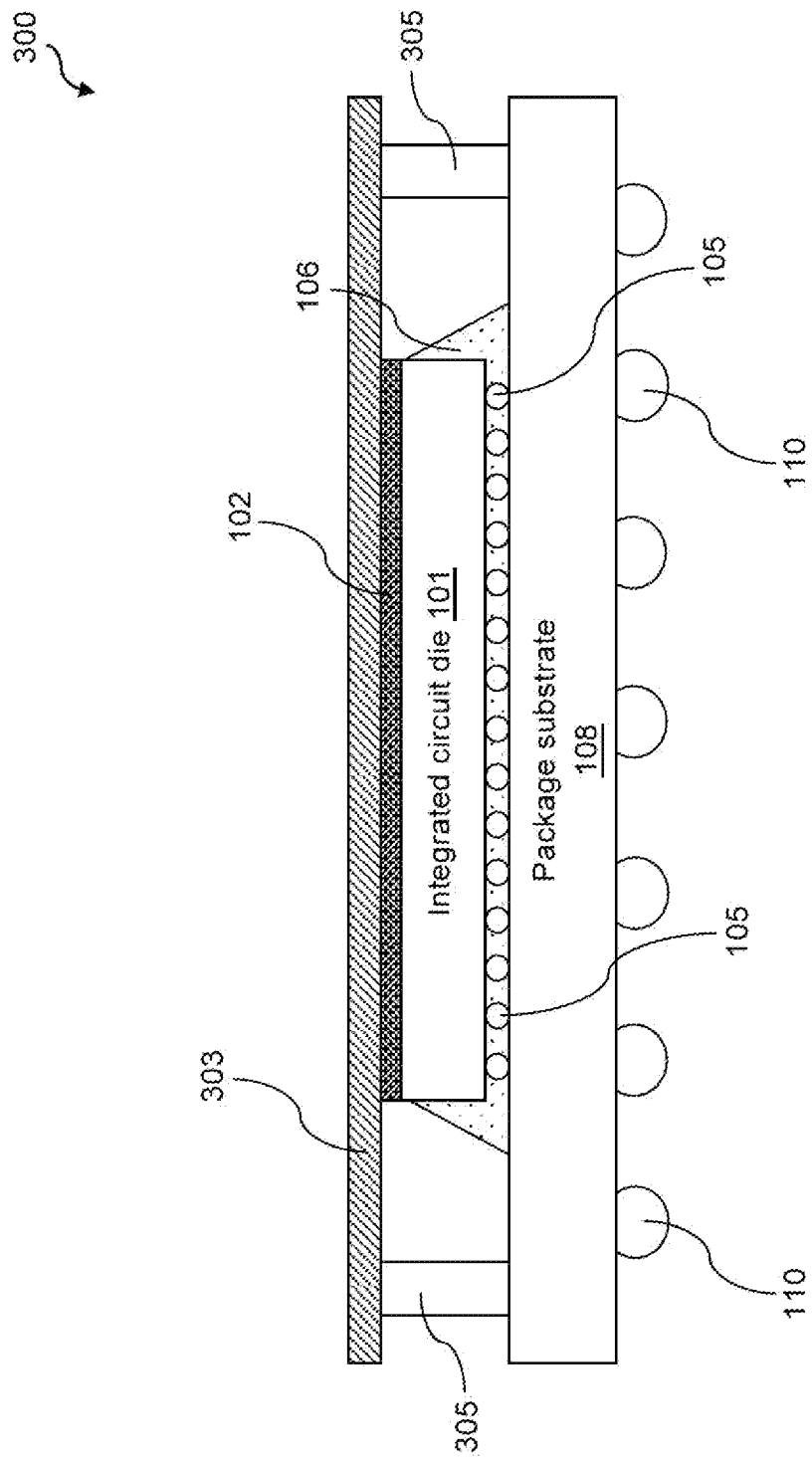
FIG. 3 is a side view of an illustrative integrated circuit package with support members attached at corners of a package substrate in accordance with an embodiment of the present invention.

The present invention may also be implemented in different integrated circuit package configurations. FIG. 3 is a side view of illustrative integrated circuit package 300 with support members attached at corners of package substrate 108 in accordance with an embodiment of the present invention. It should be appreciated that integrated circuit package 300 may share similar elements with integrated circuit package 100 of FIG. 1. As such, for the sake of brevity, elements that have been described above, such as microbumps 105, underfill 106, package substrate 108, and solder balls 110, will not be described in detail.

Metal layer 102 may be formed between integrated circuit die 101 and heat spreading lid 303. In one embodiment, heat spreading lid 303 has flat inner and outer surfaces. Such a configuration may provide increased heat dissipation for small-sized dies, such as integrated circuit die 101. Additionally, support members 305 are formed between the inner surface (e.g., adjacent to metal layer 102) of heat spreading lid 303 and package substrate 108. In one embodiment, support members 305 are attached to the corners of package substrate 108 to provide structural support to integrated circuit package 300. In one embodiment, support members 305 may be copper posts or pillars.

Figure 4:
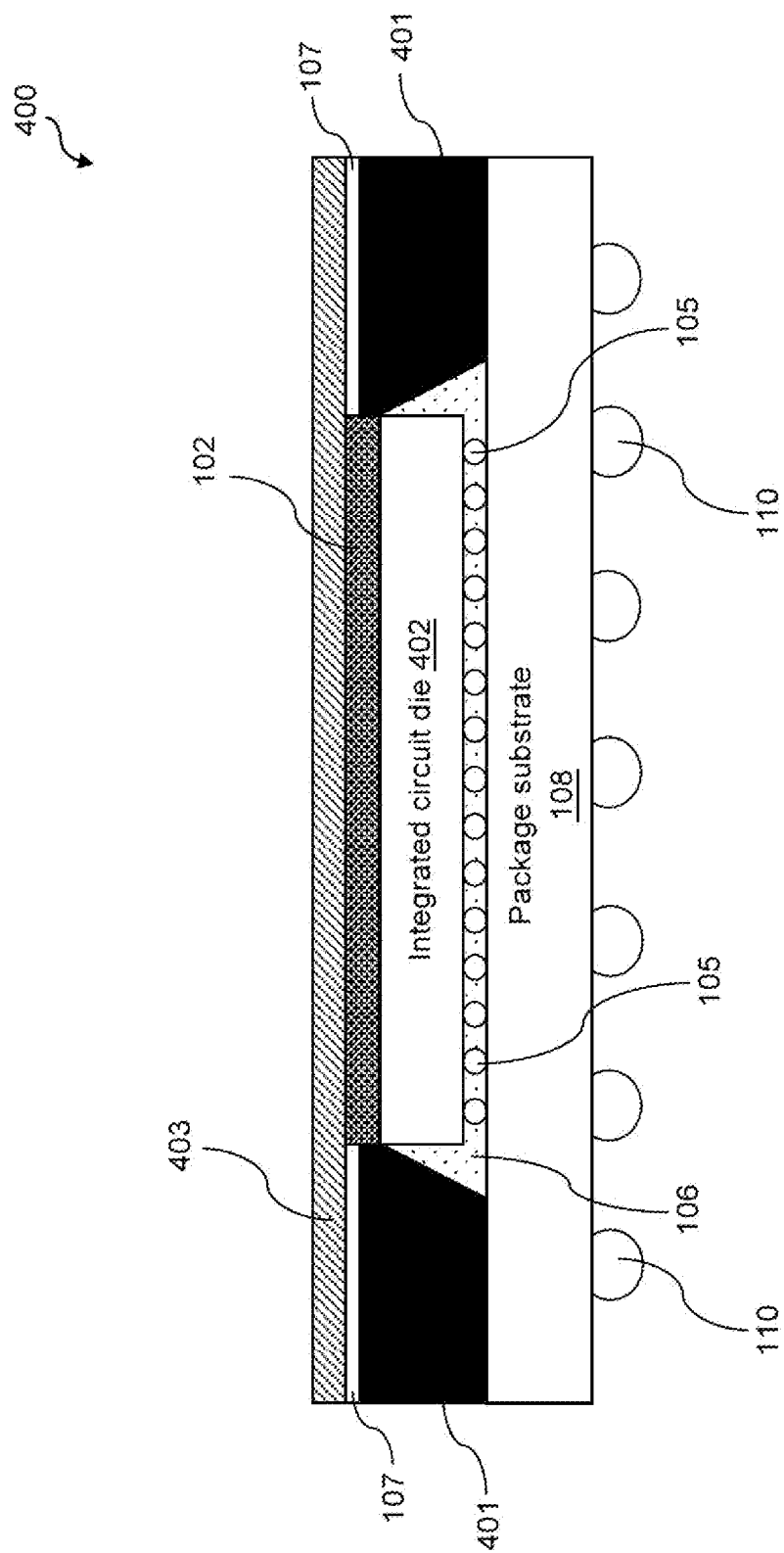
FIG. 4 is a side view of an illustrative integrated circuit package in accordance with an embodiment of the present invention.

In some scenarios, integrated circuit packages with large integrated circuit dies may be provided. FIG. 4 is a side view of illustrative integrated circuit package 400 in accordance with an embodiment of the present invention. It should be appreciated that integrated circuit package 400 may share similar elements with integrated circuit packages 100 and 300 of FIGS. 1 and 3. As such, for the sake of brevity, elements that have been described above, such as package substrate 108, microbumps 105, underfill 106, and solder balls 110, will not be described in detail. As shown in FIG. 4, integrated circuit package 400 may include integrated circuit die 402 that is surrounded by molding compound 401.

Metal layer 402 may be formed between integrated circuit die 402 and heat spreading lid 403. In one embodiment, a layer of metal (e.g., metal heat conducting layer 202A of FIG. 2) may be formed on backside of integrated circuit die 402. Accordingly, another layer of metal (e.g., metal heat conducting layer 202B of FIG. 2) may be partially formed (e.g., by plating) on an inner surface of heat spreading lid 403. In the embodiment shown in FIG. 4, the layer of metal on the inner surface of the heat spreading lid 403 may be sized to the dimension (e.g., width and length) of integrated circuit die 402.

In one embodiment, metal layer 402 may be implemented in integrated circuit packages having molding compound, such as integrated circuit package 400. In one embodiment, molding compound 401 may be formed, placed or inserted between package substrate 108 and heat spreading lid 403 prior to lid attachment. In one example, molding compound 401 may be formed to encapsulate integrated circuit die 402 on package substrate 108 to protect integrated circuit die 402 and its electrical connections (not shown) from breakage and hazardous environmental contaminants. In one embodiment, molding compound 401 may be composed of a mixture of an epoxy resin and ceramic filler material.

During the lid attachment, the direct mating between the layer of metal on the backside of integrated circuit die 402 and the layer of metal on the inner surface (e.g., center region) of heat spreading lid 403 forms metal layer 402. The remaining portion of heat spreading lid 403 can be attached to molding compound 401 via a commonly-used adhesive (e.g., adhesive 107).

Figure 5:
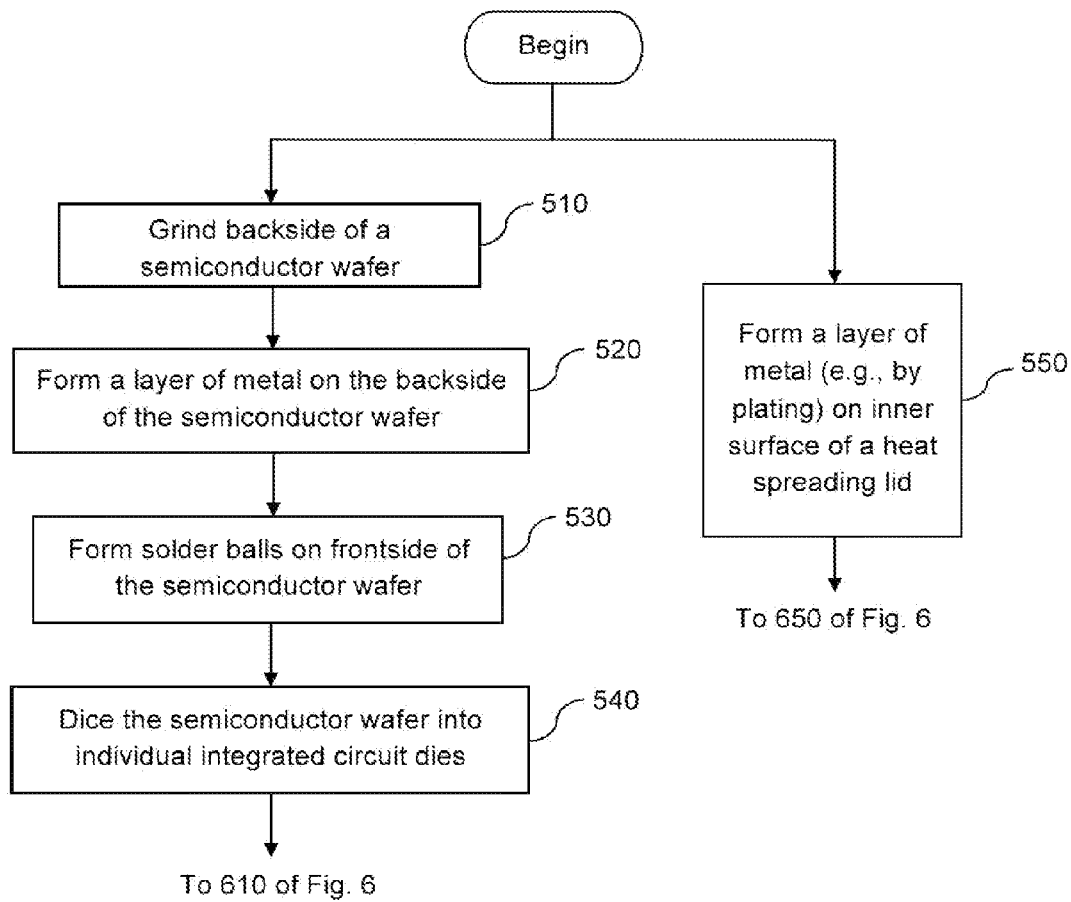
FIG. 5 shows illustrative steps for manufacturing an integrated circuit die and a heat spreading lid in accordance with one embodiment of the present invention.

FIG. 5 shows illustrative steps for manufacturing an integrated circuit die and a heat spreading lid in accordance with one embodiment of the present invention. At step 510, the backside (or non-active) of a semiconductor wafer is ground. In general, the backside of the semiconductor wafer can be processed as needed to remove any inconsistency in thickness and to polish to ensure a planar surface. For example, the backside of the semiconductor wafer is ground with a grinding stone to thin the semiconductor wafer.

A layer of metal is then formed on the backside of the semiconductor wafer at step 520. In one embodiment, the layer of metal is formed on the backside of the semiconductor wafer with heat conducting material. In another embodiment, in which dicing of the semiconductor wafer is performed first, the layer of metal can be formed on the backside of an individual die instead. For example, as shown in FIG. 2, a placing process may be performed to form metal heat conducting layer 202A on the backside of integrated circuit die 101. Alternatively, metal heat conducting layer 202A may be deposited on the backside of integrated circuit die 101 via physical vapor deposition (PVD), chemical vapor deposition (CVD), sputtering, atomic layer deposition (ALD), electrochemical deposition, and other suitable film deposition techniques. For example, conductive metal material such as aluminum, copper, gold, or Indium may be used to form metal heat conducting layer 202A.

At step 530, solder bumps are formed on the front side of the semiconductor wafer. The front side of the wafer is electrically active and is bumped with solder bumps or balls that will be later used to form electrical connections between an integrated circuit die (e.g., integrated circuit die 101 of FIGS. 1 and 3 and integrated circuit die 402 of FIG. 4) and a package substrate (e.g., package substrate 108 of FIGS. 1, 3 and 4). It should be appreciated that the solder bumps may be of any composition, size, and arrangement. Subsequently, the semiconductor wafer is diced into individual integrated circuit dies at step 540.

At step 550, a layer of metal is formed on an inner surface (e.g., adjacent to the backside of the integrated circuit die) of a heat spreading lid. For example, the layer of metal (e.g., metal layer 102 of FIGS. 1, 3 and 4) may be formed through a plating process. The layer of metal may be a metal heat conducting layer formed from heat conducting material such as aluminum, copper, gold or Indium.

It should be noted that in practice, one or more steps involving the same integrated components may be combined with other steps, performed in any suitable order, performed in parallel (e.g., simultaneously or substantially simultaneously), or removed. For example, steps 510-540 involve a semiconductor wafer and these steps may be combined and performed in parallel with step 550, which involves a heat spreading lid.

A more detailed description of the assembly of the individual integrated circuit dies and the heat spreading lid will be described below with reference to steps 610-630 of FIG. 6 and steps 710-750 of FIG. 7.

Figure 6:
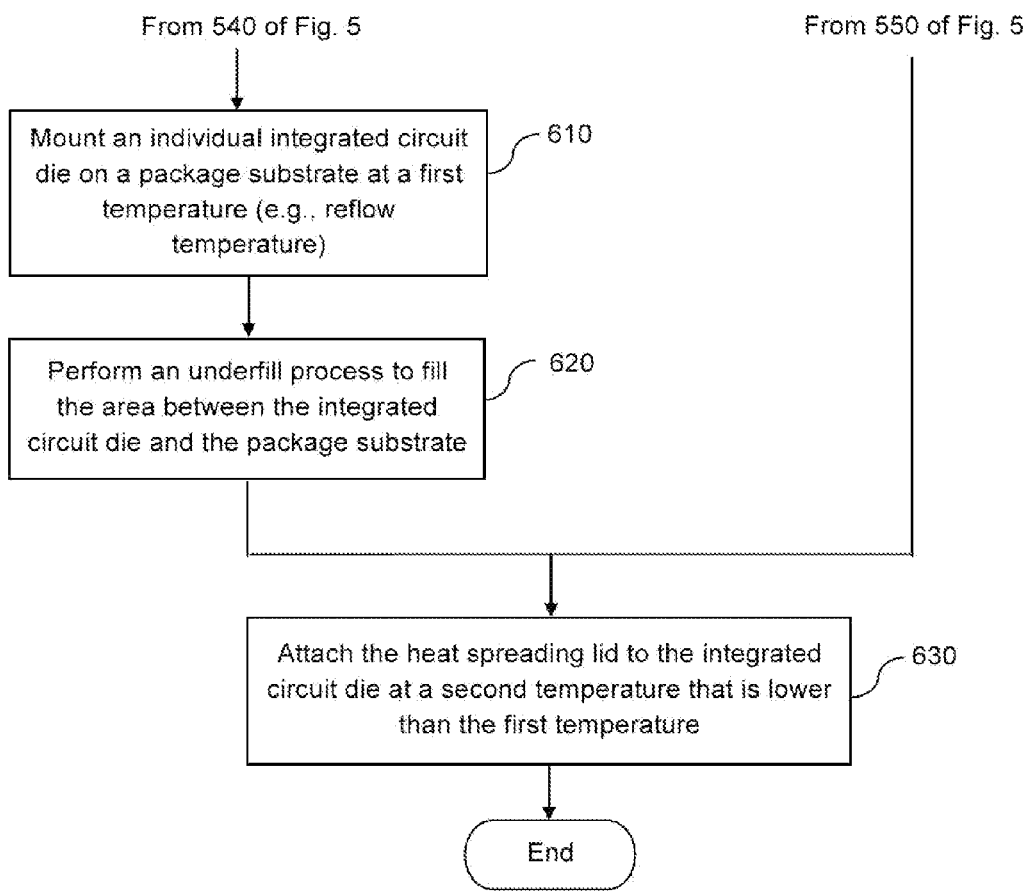
FIG. 6 shows illustrative steps for assembling an integrated circuit package in accordance with one embodiment of the present invention.

FIG. 6 shows illustrative steps for assembling an integrated circuit package in accordance with one embodiment of the present invention. With reference to steps 510-540 shown in FIG. 5, an individual integrated circuit die with a layer of metal on its backside is mounted on a package substrate at a first temperature at step 610. As shown in FIG. 1, integrated circuit die 101 is mounted on package substrate 108. A reflow process is conducted so that integrated circuit die 101 is mechanically and electrically connected to package substrate 108 by solder bumps (e.g., microbumps 105) at the first temperature. The first temperature is a reflow temperature at which microbumps 105 begin to melt in order to attach the integrated circuit die 101 to the package substrate 108. For example, microbumps 105 are thermally reflowed at a reflow temperature of about 250° C.

At step 620, an underfill process is performed to fill the area between the integrated circuit die and package substrate. For example, as shown in FIGS. 1, 3 and 4, underfill 106 is dispensed to fill a gap between integrated circuit die 101 and package substrate 108, so as to improve bonding between integrated circuit die 101 and package substrate 108.

At step 630, a heat spreading lid is attached to the integrated circuit die at a second temperature that is lower than the first temperature. In one embodiment, the heat spreading lid is attached to the integrated circuit die after the assembly of the integrated circuit die on the package substrate, as mentioned in steps 610-620 above. With reference to steps 520 and 550 of FIG. 5, a layer of metal is formed on the back surface of a semiconductor wafer (which is later diced into individual integrated circuit dies) and the inner surface of the heat spreading lid, respectively. For example, the layer of metal may be a low-temperature metal such as aluminum, copper, gold, and Indium. In general, indium has a lower melting point than solder (e.g., solder bumps 105 of FIG. 1). For example, the melting point of Indium is about 156.6° C. whereas the melting point of solder is about 250° C. to 316° C. During lid assembly, the heat spreading lid is attached over the integrated circuit die at a temperature lower than the reflow temperature of 250° C. so that only the layer of metal melts.

Figure 7:
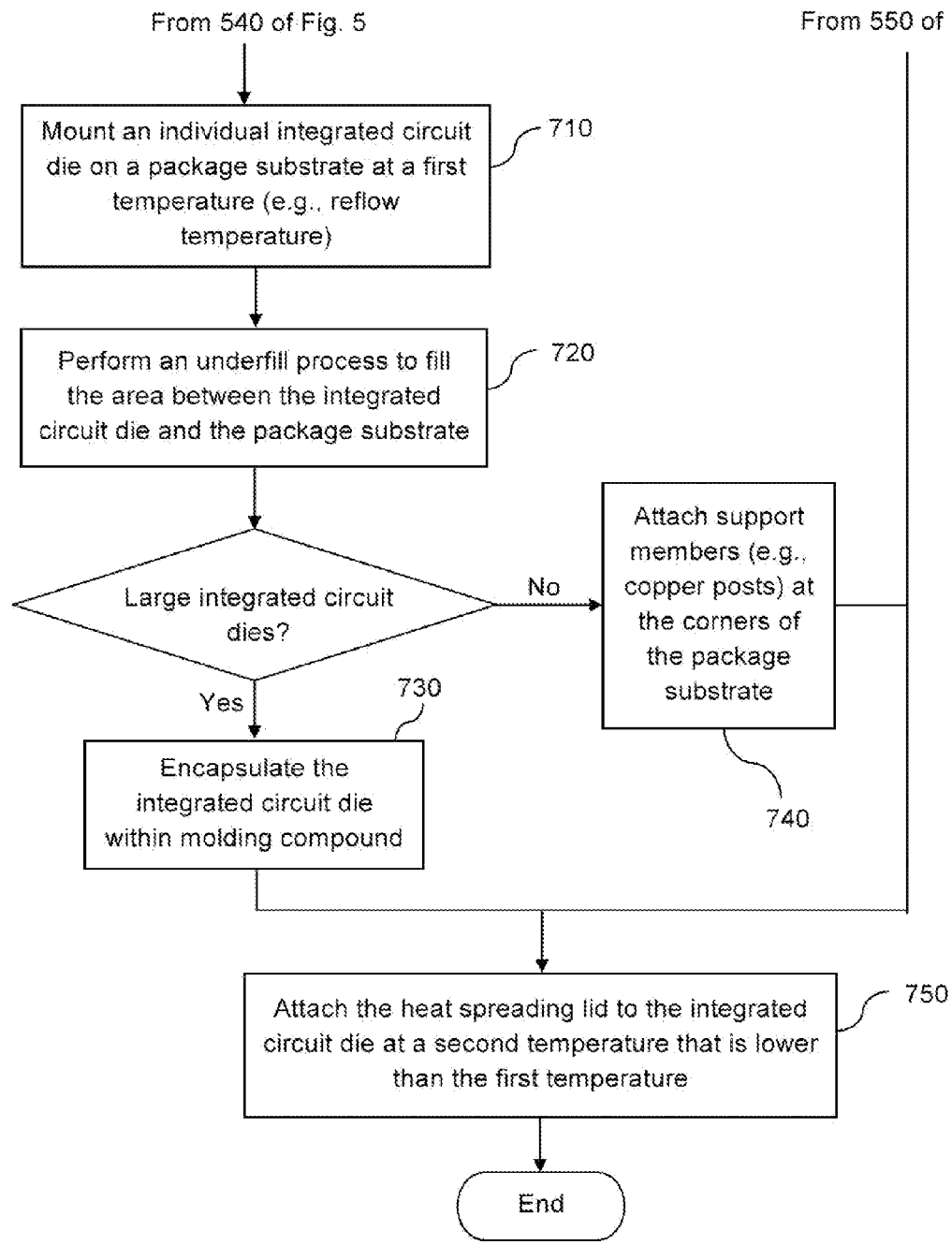
FIG. 7 shows illustrative steps for assembling an integrated circuit package in accordance with one embodiment of the present invention.

FIG. 7 shows illustrative steps for assembling an integrated circuit package in accordance with one embodiment of the present invention. It should be appreciated that steps 710, 720 and 750 are substantially similar to steps 610, 620 and 630, respectively. The actions performed are the same as those described above. It should be noted that dies of different sizes may be used during the respective assembly processes shown in FIGS. 6 and 7.

At step 710, an individual integrated circuit die is assembled on a package substrate at a first temperature. Solder bumps are formed between the integrated circuit die and package substrate. For example, the assembly may take place under a heating temperature used in a reflow process. The heating temperature, which is approximately 250° C., causes the solder bumps to melt or "reflow." The solder bumps then hold the integrated circuit die to the package substrate. This allows the integrated circuit die to mechanically and electrically connect to the package substrate. Alternatively, a wave soldering process may be used during the assembly, in which the integrated circuit die is placed over a bath of molten solder on the package substrate.

At step 720, an underfill process is performed to fill the area between the integrated circuit die and the package substrate.

For large integrated circuit dies, the integrated circuit die may be encapsulated within a molding compound at step 730. The molding compound may be deposited around the integrated circuit die. In one embodiment, support members, such as copper posts (e.g., support members 305 of FIG. 3), may be attached at corners of the package substrate at step 740 to provide additional mechanical support.

At step 750, a heat spreading lid is attached to the integrated circuit die at a second temperature that is lower than the first temperature. For example, the second temperature (e.g., at room temperature) is lower than the reflow temperature, which is less than 250° C. Such a temperature may allow only the metal layer to melt such that the heat spreading lid can be coupled to the integrated circuit die. Such a temperature may also prevent further reflowing of the solder bumps mentioned in step 710 of FIG. 7, thereby preventing the integrated circuit die from collapsing.

The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method of manufacturing an integrated circuit package, comprising:
    depositing a first metal heat conducting layer on a non-active planar surface of a semiconductor wafer;
    dicing the semiconductor wafer into individual integrated circuit dies;
    assembling an individually diced integrated circuit die on a package substrate at a first temperature such that the first metal heat conducting layer is facing away from the package substrate; and
    after assembling the individually diced integrated circuit die on the package substrate, attaching a heat spreading lid directly on the first metal heat conducting layer at a second temperature that is different than the first temperature.

2. The method defined in claim 1 wherein the heat spreading lid has inner and outer surfaces, the method further comprising:
    depositing a second metal heat conducting layer on the inner surface of the heat spreading lid such that the first and second metal heat conductive layers are physically touching when assembled.

3. The method defined in claim 2, wherein the first and second metal heat conducting layers are selected from the group consisting: aluminium, copper, gold, and indium.

4. The method defined in claim 3, wherein attaching the heat spreading lid to the integrated circuit die comprises bonding the first metal heat conducting layer to the second metal heat conducting layer at the second temperature.

5. The method defined in claim 4, wherein the second temperature is less than the first temperature.

6. The method defined in claim 1, further comprising:
    attaching the heat spreading lid to the package substrate to enclose the integrated circuit die.

7. The method defined in claim 1 wherein assembling the integrated circuit die on the package substrate comprises:
    forming solder bumps on the integrated circuit die; and
    melting the solder bumps at the first temperature to electrically couple the integrated circuit die to corresponding connections on the package substrate.

8. The method defined in claim 7, wherein the integrated circuit package comprises a flip-chip assembly.

9. A method of manufacturing an integrated circuit package, comprising:
    forming a first metal layer on a back side of a semiconductor wafer;
    forming solder balls on a front side of the semiconductor wafer;
    forming a second metal layer on an inner surface of a heat spreading lid;
    dicing the semiconductor wafer into a plurality of individual dies;
    mounting a die in the plurality of individual dies on a package substrate at a reflow temperature; and
    after mounting the die on the package substrate at the reflow temperature and after forming the second metal layer on the inner surface of the heat spreading lid, attaching the heat spreading lid to the die by bonding the first metal layer on a back side of the die to the second metal layer on the inner surface of the heat spreading lid.

10. The method defined in claim 9, further comprising:
    grinding the back side of the semiconductor wafer before forming the first metal layer on the back side.

11. The method defined in claim 9, wherein bonding the first metal layer on the back side of the die to the second metal layer on the inner surface of the heat spreading lid comprises bonding the first and second metal layers at a temperature that is lower than the reflow temperature.

* * * * *